United States Patent [19]

Baumann et al.

[11] Patent Number: 5,409,891
[45] Date of Patent: Apr. 25, 1995

[54] METHOD FOR PRODUCING A ROTATIONALLY SYMMETRICAL MOLDED PART OF A HIGH-TEMPERATURE SUPERCONDUCTOR

[75] Inventors: Thomas Baumann, Wettingen; Peter Unternährer, Würenlos, both of Switzerland

[73] Assignee: Asea Brown Boveri Ltd., Baden, Switzerland

[21] Appl. No.: 124,462

[22] Filed: Sep. 22, 1993

[30] Foreign Application Priority Data

Oct. 12, 1992 [DE] Germany ............ 42 34 310.0

[51] Int. Cl.⁶ .................. H01L 39/12; B28B 1/20
[52] U.S. Cl. ........................ 505/450; 264/82; 264/270; 264/311; 505/490; 505/492; 505/500
[58] Field of Search ............. 505/1, 739, 741, 742, 505/782, 450, 470, 490, 492, 500; 264/82, 85, 104, 235, 267, 270, 311, 332

[56] References Cited

U.S. PATENT DOCUMENTS

| 4,632,686 | 12/1986 | Brown et al. ............ 264/311 |
| 5,151,407 | 9/1992 | Provenzano et al. ........ 505/739 |

FOREIGN PATENT DOCUMENTS

| 0327044A1 | 8/1989 | European Pat. Off. |
| 0351844A2 | 1/1990 | European Pat. Off. |
| 0462409A1 | 12/1991 | European Pat. Off. |
| 0482221A1 | 4/1992 | European Pat. Off. |
| 3830092A1 | 3/1990 | Germany |
| 4019368A1 | 12/1991 | Germany |

OTHER PUBLICATIONS

"Phase Relations and Alignment in Bismuth-Based Tc Wires", Hellstrom, JOM, Oct. 1992, pp. 48–53.
JP 2-192615 A: in Derwent, Ref. 90-272081/36.
JP 2-145423 A: in Derwent, Ref. 90-214336/28.
JP 1-163919 A: in Derwent, Ref. 89-229968/32.

*Primary Examiner*—Christopher A. Fiorilla
*Attorney, Agent, or Firm*—Burns, Doane, Swecker & Mathis

[57] ABSTRACT

A rotationally symmetrical molded part of a high-temperature superconductor achieves a critical current density of $j_c \geq 800$ A/cm² at a temperature of 77K, by using a powder mixture (8) having the stoichiometric composition of $Bi_{2+x}EA_3Cu_2O_y$, where $-0.15 < x < 0.4$; EA = an alkaline earth metal or a mixture of alkaline earth metals, in particular a mixture of Sr and Ca in the ratio of $Sr:Ca = (2+z):(1-z)$, where $0 < x < 0.2$; $8 \leq y \leq 8.3$. With the aid of a conveying chute (9), the powder mixture (8) is brought uniformly at room temperature with a grain size of $<50$ μm into a silver mold (5) which is arranged inside a rotating fusion mold (4), open at one side, in a furnace (3). Subsequently, the fusion mold (4) is accelerated, heated to 500° C. and held for approximately 30 min at 500° C. After subsequent partial melting at a temperature of $T_mK$ to $T_m + 6K$, where $T_m$ = melting temperature of the pulverulent starting material, for 30 min to 2 h at an oxygen partial pressure of $p(O_2) \geq 0.8$ bar, a first long-term annealing is performed at 840° C. to 850° C. for 20 h to 40 h. Thereafter, a second long-term annealing is performed at a reduced oxygen partial pressure of $p(O_2)$ and, below 700° C., cooling to room temperature in a nitrogen atmosphere. There can be a subsequent third long-term annealing.

20 Claims, 2 Drawing Sheets

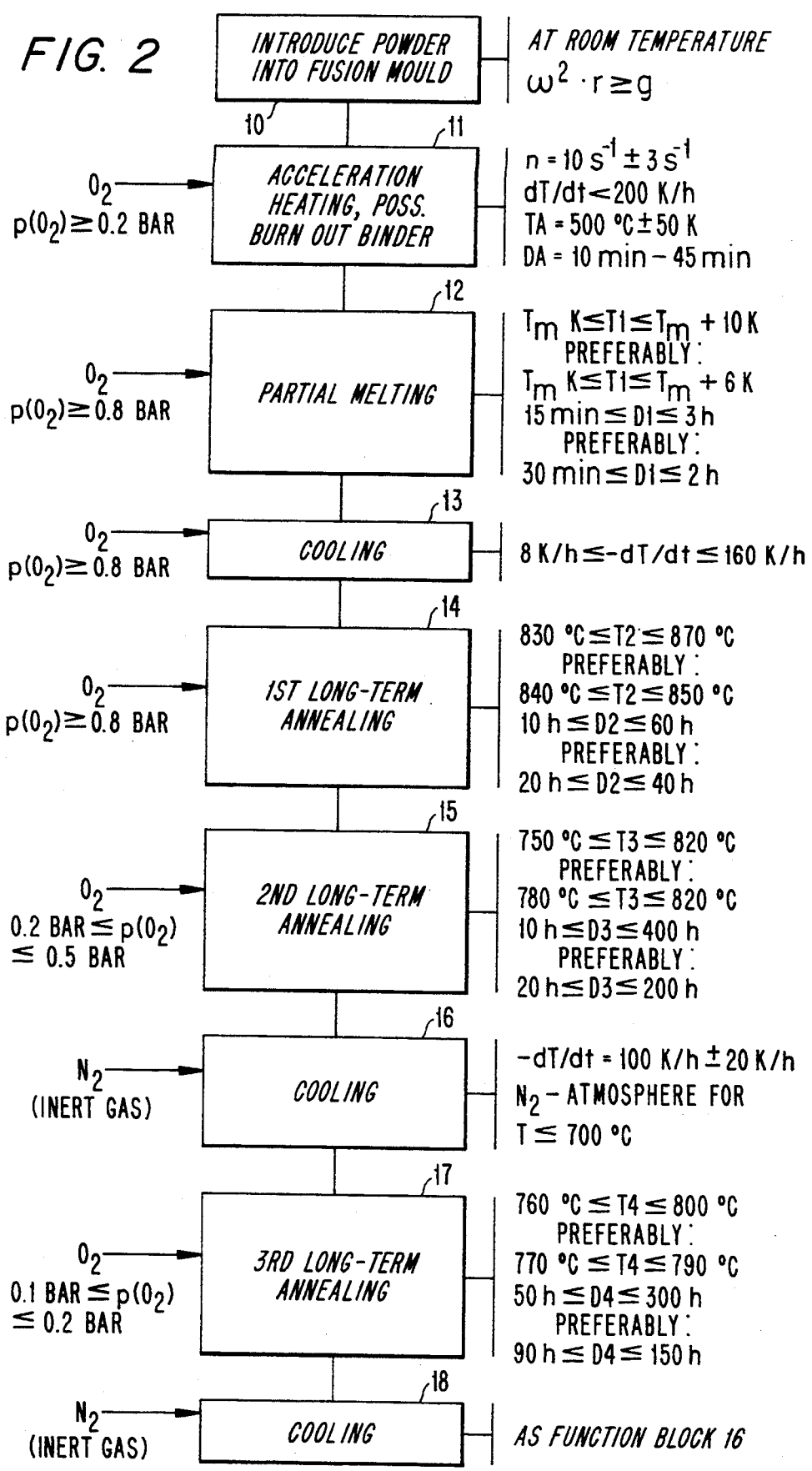

METHOD FOR PRODUCING A ROTATIONALLY SYMMETRICAL MOLDED PART OF A HIGH-TEMPERATURE SUPERCONDUCTOR

BACKGROUND OF THE INVENTION

1. Field of the Invention

The invention relates to a method for producing a rotationally symmetrical molded part of a high-temperature superconductor.

2. Discussion of Background

DE-A1-4,019,368 discloses a method is described for producing cylinders or rings on the basis of a bismuth two-layer cuprate. In this case, the homogeneous melt is spun into a rotating, cold fusion mold. Very different solidification rates at the edge and in the interior of the specimen produce a microstructure having a very different density and full of internal stresses. Nothing is reported on the values of the critical current density.

EP-A1-0,482,221 discloses a method for producing a ceramic high-temperature superconductor of the Bi-Sr-Ca-Cu-O type, in which the ratio of Bi:Sr:Ca:Cu is $(2-x):2:(1+v):(2+w)$, where $0.05 \leq x \leq 0.6$; $0 < v \leq 0.5$ and $0 < w \leq 0.5$. Oxides of Bi and Cu and carbonates of Ca and Sr are converted below the melting temperature, preferably at 800° C., into a Bi 2-layer compound. The powder mixture is then pressed into a desired shape and melted a few degrees above the melting temperature for 1 h at 1 bar $O_2$. In a two-stage process, (13 h at 860° C. at 1 bar $O_2$ and 60 h at 800° C. in air), the material is aftertreated and converted into the Bi 2-layer compound. The subsequent cooling was carried out below 700° C. in an $N_2$ atmosphere. In the absence of a magnetic field, the critical current density $j_c$ was 1.6 $kA/cm^2$. $j_c(B=0)$ was measured as 2.12 $kA/cm^2$ for $x=0.05$ and an aftertreatment of 18 h at 800° C.

It has been disclosed in EP-A2-0,351,844 to produce a high-temperature superconductor of the Bi-Sr-Ca-Cu-O type with a critical temperature of 94K and a critical current density of 2 $kA/cm^2$. After heat treatment for 30 minutes in an oxygen atmosphere at 900° C., heating was carried out for 10 minutes to 920° C. and annealing was subsequently carried out for 6 h at 880° C. Thereafter, cooling was performed at a cooling rate of 2K/min to 600° C., and subsequently in a nitrogen atmosphere down to room temperature.

Jun-ichiro Kase et al., Partial Melt Growth Process of $Bi_2Sr_2Ca_1Cu_2O_x$ Textured Tapes on Silver, Japanese Journal of Applied Physics, Vol. 29, No. 7, July 1990, pages L1096–L1099 has disclosed achieving a critical current density $j_c$ of 13 $kA/cm^2$ for orientated thick films at a temperature of 77K without an external magnetic field.

A disadvantage of this method is the restriction to film thicknesses of $< 100 \mu m$.

As in the case of the method according to the above-mentioned. EP-A2-0,351,844, here, as well, the powder, pressed or poured, is applied to a planar substrate, preferably made from silver. Under the action of gravity in the partially melted state, the powder is compressed to form a compact body or film. In the case of non-planar, e.g. cylindrical substrates, this method fails due to non-uniform running or running out of the liquid.

The article by G. Triscone et al., Variation of the superconducting properties of $Bi_2Sr_2CaCu_2O_{8+x}$ with oxygen content, Physics C 176 (1991), pages 247–256, particularly FIG. 1 on page 248, discloses how the critical temperature $T_c$ depends on the oxygen partial pressure in the case of equilibrium heat treatment. It is therefore possible to optimize Bi2212 superconductors of any type of manufacture and size with respect to the critical temperature.

SUMMARY OF THE INVENTION

An object of the invention is to provide a novel method for producing a rotationally symmetrical molded part of a high-temperature superconductor of the type mentioned at the beginning in such a way that it is possible to achieve a critical current density of $> 800 \text{ A/cm}^2$ at a temperature of 77K.

An advantage of the invention consists in that it is possible to work with relatively high currents in the case of a given conductor cross section. For example, it is possible to produce molded pieces having a high current carrying capacity for shielding purposes and for inductive current limiters.

A further advantage consists in that the homogeneous solidification of the rotating melt also leads to a homogeneous microstructure of the molded part. As a result, the superconducting characteristics do not depend on the thickness of the cylinder, and it is also possible to produce workpieces having a thickness of less than 2 mm while retaining high values of the critical current density.

It is particularly advantageous to leave the high-temperature superconductor in the fusion mold when it is intended to be used for shielding purposes. In this case, the metal, for example silver, inserted into the fusion mold acts as a highly conductive bypass.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 shows a flow diagram of the production method of a rotationally symmetrical high-temperature superconductor.

DESCRIPTION OF THE PREFERRED EMBODIMENTS

Figure 1:
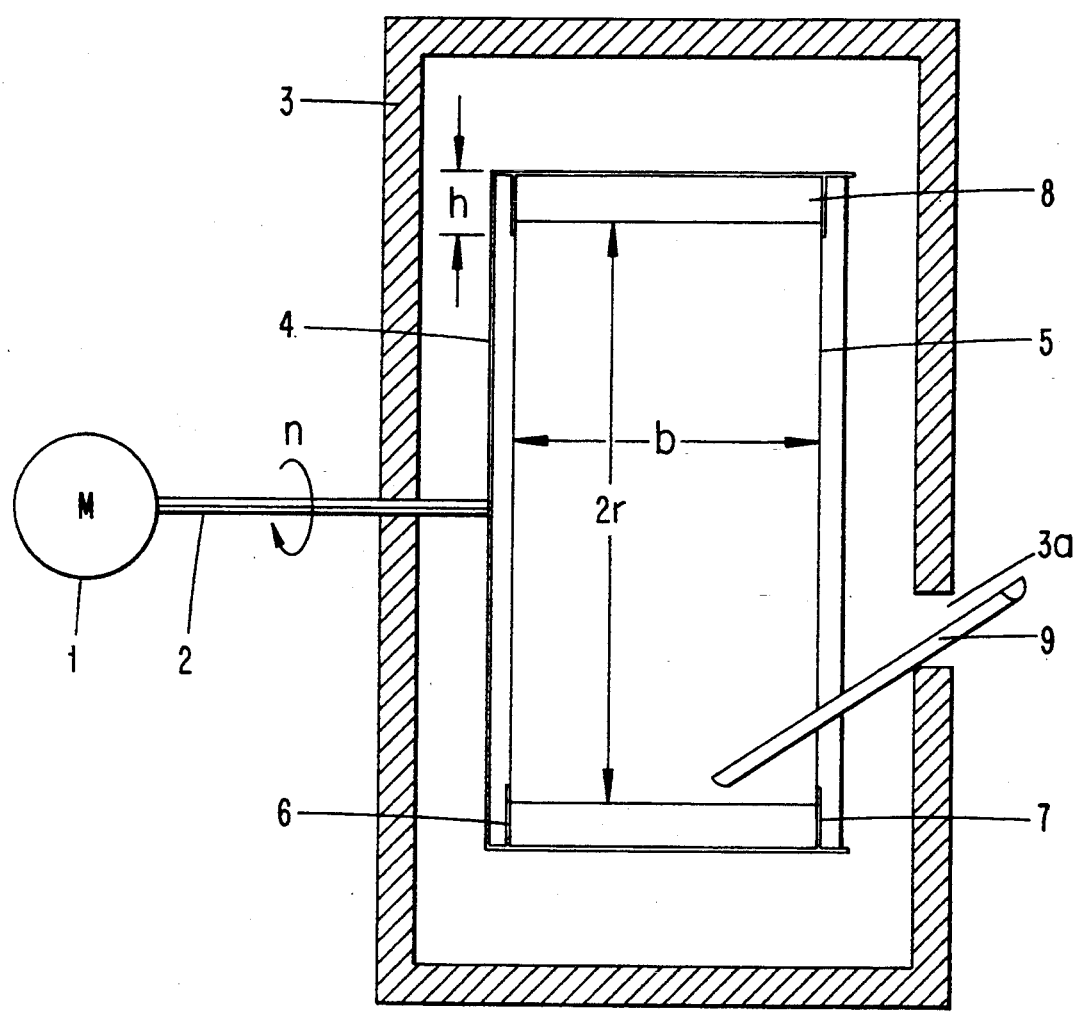
FIG. 1 shows a furnace with a motor-driven fusion mold.

Referring now to the drawings, (1) in FIG. 1 denotes a controllable motor which is rotatably connected via a drive shaft (2) to a drum or fusion mold (4) made from a high-temperature resistant steel or ceramic. The fusion mold (4), which is arranged in a controllable furnace (3) and open only on the right-hand side has a depth or width of 80 mm and a diameter of 200 mm. Inserted into the fusion mold (4) is a metal mold or a silver molded part or a silver plate (5), flanged in a profiled fashion, having a front stop (6) and a rear stop (7). These stops (6, 7) have a prescribable edge height (h). The silver plate (5) has a thickness of 0.2 mm and a width (b) of 70 mm.

The fusion mold (4) consists of a high-temperature resistant metal whose coefficient of linear expansion is equal to or up to 5 $\mu m/m \cdot K$ larger than that of the superconductor. The metal mold (5) made from a material which is inert with respect to the superconductor and its melting phases, preferably made from silver or gold or from an alloy of these metals, can subsequently remain on the superconductor as armoring.

In another embodiment, the silver can be applied, for example, by electroplating as a layer in a manner permanently adhering to the fusion mold (4). In this case, the front and rear stops (6, 7) are eliminated.

Use is made as starting material for a partial melting of a powder mixture having a stochiometric composition of $Bi_{2+x}EA_3Cu_2O_y$, where $-0.15<x<0.4$; and EA=an alkaline earth metal or a mixture of alkaline earth metals, in particular a mixture of Sr and Ca in the ratio of Sr:Ca=(2+z):(1−z), where $0<z<0.2$, preferably in the ratio of 2.2:0.8; $8 \leq y \leq 8.3$. Silver powder can be admixed with the powder in a proportion of up to 10 mol %. Before partial melting, this powder mixture is subjected to a further preliminary process described further below.

This pulverulent starting material or $Bi_2Sr_2CaCu_2O_8$ powder (8) is introduced into the fusion mold (4) at room temperature via a conveying chute (9), either dry or as a suspension consisting of powder, organic solvent and binder. The conveying chute (9) is guided through a sealable opening (3a) in the furnace (3). While the powder (8) is being introduced, a rotational speed (n) of the fusion mold (4) must be large enough for the centrifugal acceleration $\omega^2 \cdot r$ acting on the powder (8) at least to compensate the acceleration (g) due to gravity, that is to say it must be that $(2\pi n)^2 \cdot r \geq g$, r=internal radius of the powder (8) in the fusion mold (4), $\omega = 2\pi n$=angular frequency, cf. the function block (10) in FIG. 2. The rotational speed (n) of the fusion mold (4) should preferably be brought to a value of $n > [1.3 \cdot g/(\pi^2 \cdot d)]^{0.5}$, where $\pi = 3.14$, and d=diameter of the fusion mold (4).

The remainder of the method for producing a rotationally symmetrical molded part of a high-temperature superconductor is explained with the aid of FIG. 2.

After the introduction of the powder (8) into the fusion mold (4), the rotational speed (n) thereof is increased, as in a centrifuge, to a value $n = 10 \, s^{-1} \pm 3 \, s^{-1}$, in order to achieve a further certain compaction of the powder. The furnace atmosphere can be adjusted in a defined fashion by blowing in gases such as, for example, $O_2$, $N_2$, Ar. Underpressures and overpressures are possible in a gas-tight design. If the powder (8) has been introduced as a suspension, heating is then carried out, while maintaining the rotational speed (n), at an oxygen partial pressure of $p(O_2) \geq 0.2$ bar and a heating rate of $dT/dt < 200K/h$ to a burn-out temperature (TA) of 500° C. ±50K and held during a burn-out period (DA) in the range of 10 min–45 min at this burn-out temperature (TA), cf. function block (11). At this burn-out temperature (TA), the binder, if present, is to be burned out.

The powder (8) which is to be melted and is melted also remains in the fusion mold (4) during the further method steps specified in function blocks (12–18), heating and cooling rates always being kept at <300K/h. Consequently, the fusion mold (4) and high-temperature superconductor are isothermal. Strong thermal gradients are thereby avoided, resulting in a dense, homogeneous microstructure.

The partial melting is carried out at a first process temperature (T1) in the range of $T_mK \leq T1 \leq T_m+10K$, preferably in a temperature range of $T_mK \leq T1 \leq T_m+6K$ during a first process period (D1) in a range of 15 min $\leq D1 \leq 3$ h, preferably in a range of 30 min $\leq D1 \leq 2$ h at an oxygen partial pressure of $p(O_2) \geq 0.8$ bar; $T_m$=melting temperature, cf. function block (12). If the melting temperature of the pulverulent starting material drops with increasing melting period, the furnace temperature is correspondingly lowered. The partial melting of the powder (8) is performed at approximately 880° C.–930° C.

In accordance With function block (13), the specimen is subsequently cooled at an oxygen partial pressure of $p(O_2) \geq 0.8$ bar and a cooling rate of $(-dT/dt)$ of $8K/h \leq -dT/dt \leq 160K/h$ to a second process temperature (T2) of a subsequent first long-term annealing.

The first long-term annealing in accordance with function block (14) is performed at an oxygen partial pressure of $p(O_2) \geq 0.8$ bar at the second process temperature (T2) in a temperature range of 830° C.$\leq T2 \leq$870° C., preferably in a temperature range of 840° C.$\leq T2 \leq$850° C. during a second process period (D2) in a period range of 10 h$\leq D2 \leq$60 h, preferably in a period range of 20 h$\leq D2 \leq$40 h. Since the superconductor solidifies during the first long-term annealing and the following process steps, and is coherent, rotation can be dispensed with from here on.

A subsequent second long-term annealing in accordance with function block (15) is performed at an oxygen partial pressure of $p(O_2)$ in a pressure range of 0.2 bar$\leq p(O_2) \leq$0.5 bar and at the third process temperature (T3) in a temperature range of 750° C.$\leq T3 \leq$820° C., preferably in a temperature range of 780° C.$\leq T3 \leq$820° C. during a third process period (D3) in a period range of 10 h$\leq D3 \leq$400 h, preferably in a period range of 20 h$\leq D3 \leq$200 h.

Thereafter, cooling is carried out, cf. function block (15), at a cooling rate of $-dT/dt=100K/h \pm 20K/h$, cooling being carried out at temperatures of $T \leq 700°$ C. in an inert gas atmosphere, preferably in a nitrogen atmosphere.

In an alternative execution of the method, the furnace (3) can be cooled to room temperature after the partial melting. The further process steps can be carried out without rotation in another furnace (not represented).

In order to optimize the critical temperature $T_c$, a third long-term annealing can thereafter be carried out in accordance with function block (17) at an oxygen partial pressure of $p(O_2)$ in a pressure range of 0.1 bar$\leq p(O_2) \leq$0.2 bar and at a fourth process temperature (T4) in a temperature range of 760° C.$\leq T4 \leq$800° C., preferably in a temperature range of 770° C.$\leq T4 \leq$790° C. during a fourth process period (D4) in a period range of 50 h$\leq D4 \leq$300 h, preferably in a range of 90 h$\leq D4 \leq$150 h.

The subsequent cooling in function block (18) takes place in a manner similar to that in accordance with function block (16).

EXAMPLE 1

700 g of $Bi_2Sr_2CaCu_2O_8$ powder (8) was uniformly distributed at a rotational speed (n) of 2.5 s$^{-1}$ in a silver mold (5) having a diameter of 200 mm, a width (b) of 80 mm and an edge height (h) of 10 mm. During heating, the rotational speed (n) was increased to approximately 10 s$^{-1}$ for the purpose of material compaction. At melting temperatures, motion was again at a lower rotational speed (n), in order to avoid phase separations. Heating was then carried out in an $O_2$ atmosphere at 1 bar and a heating rate of 60K/h to 900° C., and this temperature was held for 2 h in order to melt the pulverulent starting material. The subsequent cooling to 850° C. was performed at a cooling rate of 60K/h. The temperature of 850° C. was held for 60 h. Thereafter, cooling was performed to 700° C. Cooling to room temperature was performed at a cooling rate of 100K/h in a $N_2$ atmosphere. The superconducting cylinder thus obtained had a wall thickness of 2.5 mm and could be removed from the silver mold (5) without any problem. The critical current density ($j_c$) was 850 A/cm².

EXAMPLE 2

Instead of the silver mold (5) in accordance with Example 1, use was made of a cylindrical mold made from a high-temperature resistant Ni-Cr-alloy or an Fe-Ni alloy having a wall thickness of 1 mm, a diameter of 200 mm, a width (b) of 8 mm and an edge height (h) of 3 mm, which was electroplated with a silver layer of 50 μm. As described above, as much of a suspension of fine-grain $Bi_2Sr_2CaCu_2O_8$ powder (8) with a grain size of 5 μm was introduced into this mold under rotation for the dried coating made from $Bi_2Sr_2CaCu_2O_8$ powder (8) and binder to amount to approximately 0.2 mm. In contrast to the heating program in accordance with Example 1, the furnace atmosphere contained artificial air with 0.2 bar $O_2$ in 0.8 bar $N_2$. The residence time at 900° C. was only 10 min. Cooling from the melting temperature ($T_m$) to the holding temperature at 850° C. was performed at a cooling rate of 10K/h. The result was to obtain a layer approximately 50 μm thick having very good orientation of the crystallographic c-axis perpendicular to the axis of rotation with a critical current density ($j_c$) of approximately 8 kA/cm² at 77K. This high-temperature superconductor is preferably used in current limiters without separation from the substrate, because the external mold (5) acts with the silver as a mechanical and electrical support.

The critical transition temperature $T_c$ was above 93K in all examples.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the U.S. is:

1. A method for producing a rotationally symmetrical molded part of a high-temperature superconductor material comprising the steps of:
   introducing pulverulent starting material into a fusion mold rotating at a speed at least so large that a centrifugal force acting on the pulverulent starting material is at least equal to the earth's gravitational attraction such that the pulverulent starting material is compacted, wherein the pulverulent starting material is introduced into the fusion mold in liquid suspension at room temperature;
   heating the compacted pulverulent material to a temperature of 500° C. ±50K;
   heating the compacted pulverulent starting material at a first process temperature (T1) which is greater than the melting temperature of the pulverulent material such that the compacted pulverulent starting material is at least partially melted at the first process temperature; and
   cooling the at least partially melted material in the fusion mold to form said rotationally symmetrical molded part.

2. The method as claimed in claim 1, wherein the pulverulent starting material is melted in the fusion mold at the first process temperature in a temperature range of $T_mK \leq T1 \leq T_m+10K$ during a process period D1 in a period range of 15 min $\leq D1 \leq 3$ h, where $T_m$ = melting temperature of the pulverulent starting material.

3. The method as claimed in claim 2, wherein the melting is carried out at the first process temperature in a temperature range of $T_mK \leq T1 \leq T_m+6K$ during a process period D1 in a period range of 30 min $\leq D1 \leq 2$ h.

4. The method as claimed in claim 1, wherein
   a) melting is carried out at an oxygen partial pressure of $p(O_2) \geq 0.8$ bar, and
   b) cooling to room temperature below 700° C. is performed in a nitrogen atmosphere.

5. The method as claimed in claim 1, wherein
   a) after melting, cooling is carried out at a cooling rate ($-dT/dt$) of $8K/h \leq dT/dt \leq 160K/h$ to a second process temperature T2,
   b) a long-term annealing is carried out at the second process temperature T2 in a temperature range of 830° C. $\leq T2 \leq$ 870° C.
   c) during a process period D2 in a time range of 10 h $\leq D2 \leq 60$ h
   d) at an oxygen partial pressure of $p(O_2) \geq 0.8$ bar.

6. The method as claimed in claim 5, wherein the second process temperature T2 is in a temperature range of 840° C. $\leq T2 \leq$ 850° C.

7. The method as claimed in claim 5, wherein the at least partially melted material in the fusion mold is cooled to room temperature without rotation of the fusion mold.

8. The method as claimed in claim 1, wherein
   a) the fusion mold consists of a high-temperature resistant metal whose coefficient of linear expansion is equal to or up to 5 μm/m·K larger than that of the superconductor material,
   b) the fusion mold is lined or coated on an inside surface with a metal mold made from a material which is inert with respect to the superconductor material and its melting phases, and
   c) the metal mold remains as armoring and electrical stabilization on the superconductor material.

9. The method as claimed in claim 8, wherein the metal mold consists of silver, gold or silver-gold alloy.

10. The method as claimed in claim 1, wherein
    a) the high-temperature superconductor material comprises $Bi_{2+x}EA_3Cu_2O_y$, where $-0.15 < x < 0.4$, and EA = an alkaline earth metal or a mixture of alkaline earth metals, and
    b) the pulverulent starting material is produced by multiple calcinating and grinding steps.

11. The method as claimed in claim 10, wherein EA comprises a mixture of Sr and Ca in a ratio of Sr:Ca=$(2+z):(1-z)$, where $0 < z < 0.2$ and $8 \leq y \leq 8.3$.

12. The method as claimed in claim 1, wherein the pulverulent starting material comprises silver powder at a concentration of up to 10 mol %.

13. The method as claimed in claim 1, wherein the fusion mold is rotated about a horizontal axis.

14. The method as claimed in claim 1, wherein the pulverulent starting material is entirely melted during the heating step.

15. The method as claimed in claim 1, wherein the fusion mold is located within a furnace.

16. A method for producing a rotationally symmetrical molded part of a high-temperature superconductor material comprising the steps of:

introducing pulverulent starting material into a fusion mold rotating at a speed at least so large that a centrifugal force acting on the pulverulent starting material is at least equal to the earth's gravitational attraction such that the pulverulent starting material is compacted, wherein the pulverulent starting material is introduced into the fusion mold in liquid suspension at room temperature;

bringing the rotational speed of the fusion mold to a value of $n > [1.3*g/(\pi^2*d)]^{0.5}$, where $\pi = 3.14$, d = diameter of the fusion mold, and g = acceleration due to gravity, while heating the compacted pulverulent material to a temperature of 500° C. ±50K;

heating the compacted pulverulent starting material at a first process temperature (T1) which is greater than the melting temperature of the pulverulent material such that the compacted pulverulent starting material is at least partially melted at the first process temperature; and cooling the at least partially melted material in the fusion mold to form said rotationally symmetrical molded part.

17. A method for producing a rotationally symmetrical molded part of a high-temperature superconductor material comprising the steps of:

introducing pulverulent starting material into a fusion mold rotating at a speed at least so large that a centrifugal force acting on the pulverulent starting material is at least equal to the earth's gravitational attraction such that the pulverulent starting material is compacted;

heating the compacted pulverulent starting material at a first process temperature (T1) which is greater than the melting temperature of the pulverulent material such that the compacted pulverulent starting material is at least partially melted at the first process temperature; and cooling the at least partially melted material in the fusion mold to form said rotationally symmetrical molded part at a cooling rate (−dT/dt) of $8K/h \leq dT/dt \leq 160K/h$ to a second process temperature (T2) wherein 830° C. $\leq T2 \leq$ 870° C.;

annealing the molded part at T2 for a period (D2) wherein 10 h $\leq$ D2 $\leq$ 60 h; and further annealing the molded part at a third process temperature (T3) wherein 750° C. $\leq$ T3 $\leq$ 820° C., for a period (D3) wherein 10 h $\leq$ D3 $\leq$ 400 h at an oxygen partial pressure (p(O$_2$)) wherein 0.2 bar $\leq$ p(O$_2$) $\leq$ 0.5 bar.

18. The method as claimed in claim 17, wherein
a) after cooling to room temperature a third long-term annealing is carried out at a fourth process temperature T4 in a temperature range of 760° C. $\leq$ T4 $\leq$ 800° C.
b) during a process period D4 in a time range of 50 h $\leq$ D4 $\leq$ 300 h
c) at an oxygen partial pressure of p(O$_2$) in a range of 0.1 bar $\leq$ p(O$_2$) $\leq$ 0.2 bar.

19. The method as claimed in claim 18, wherein
a) the temperature T4 is in a temperature range of 770° C. $\leq$ T4 $\leq$ 790° C.
b) during the process period D4 in a time range of 90 h $\leq$ D4 $\leq$ 150 h.

20. The method as claimed in claim 17, wherein
a) the third process T3 temperature is in a temperature range of 780° C. $\leq$ T3 $\leq$ 820° C.
b) during the process period D3 in a time range of 20 h $\leq$ D3 $\leq$ 200 h.

* * * * *